Figure 1:
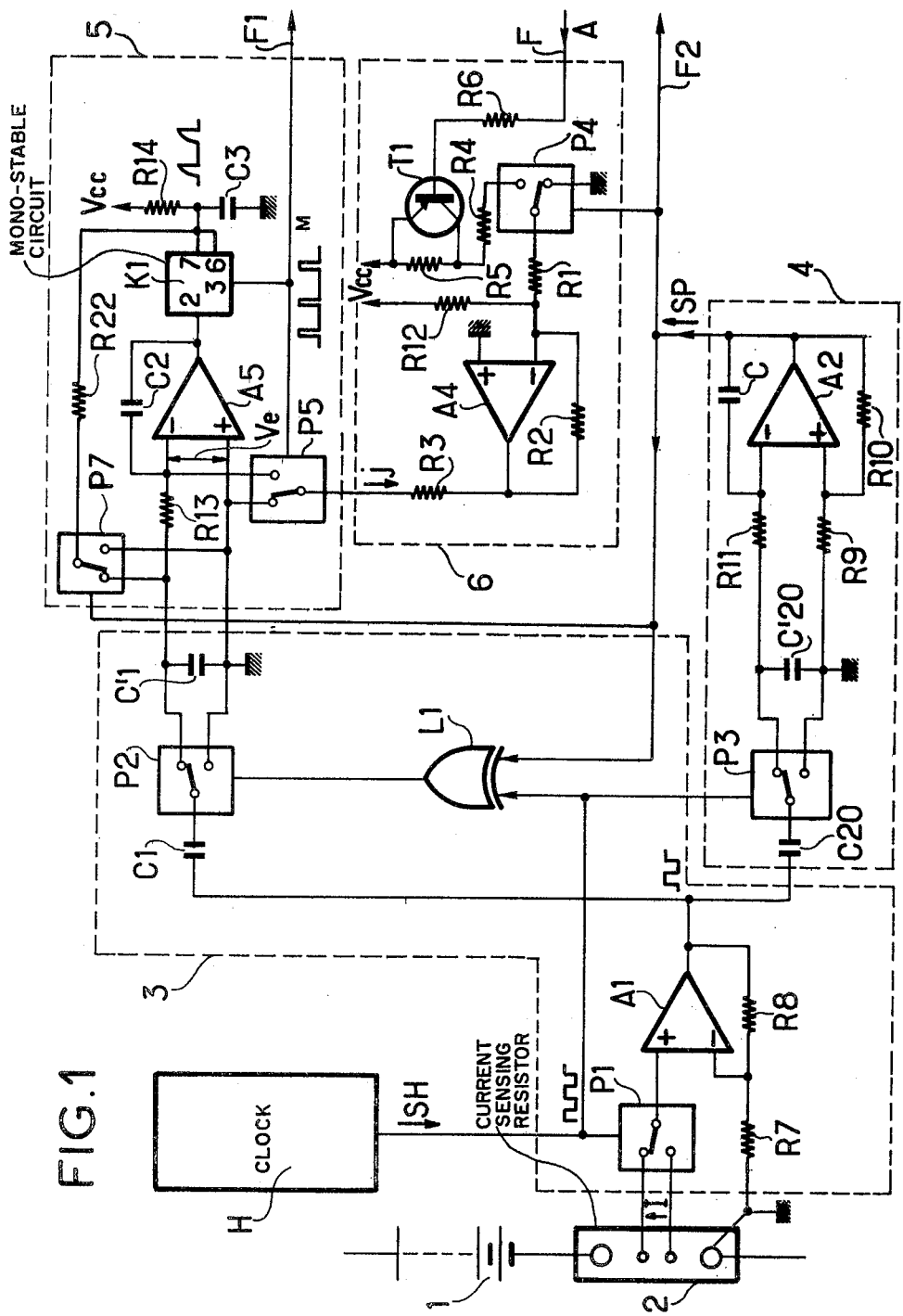

United States Patent [19]

Belot

[11] 4,307,330
[45] Dec. 22, 1981

[54] METHOD AND DEVICE FOR MONITORING THE STATE OF CHARGE OF A STORAGE BATTERY

[75] Inventor: Pierre Belot, Pavillons sous bois, France

[73] Assignee: Saft-Societe des Accumulateurs Fixes et de Traction, Romainville, France

[21] Appl. No.: 97,951

[22] Filed: Nov. 28, 1979

[30] Foreign Application Priority Data

Dec. 7, 1978 [FR] France ............................... 78 34473

[51] Int. Cl.³ .............................................. H02J 7/04
[52] U.S. Cl. ......................................... 320/44; 320/48
[58] Field of Search ...................... 320/48, 43, 44, 37, 320/38; 340/626; 324/427, 428

[56] References Cited

U.S. PATENT DOCUMENTS 4,194,146 3/1980 Patry et al. ........................ 320/48 X
4,247,812 1/1981 Patry et al. ........................... 320/44

FOREIGN PATENT DOCUMENTS 2844099 4/1979 Fed. Rep. of Germany ........ 320/43
2361754 3/1978 France .................................. 320/48

Primary Examiner—J. D. Miller
Assistant Examiner—Reinhard J. Eisenzopf
Attorney, Agent, or Firm—Kenyon & Kenyon

[57] ABSTRACT

Monitoring the state of charge consists of providing a magnitude g (e.g. a frequency F1) which is proportional to the storage battery charging or discharge current I (sensed at 2) and of algebraically integrating said magnitude (e.g. in an up/down counter K4, K5) into data which is the image of the state of charge of the storage battery; the proportionality constant a=g/I between said magnitude and said current being given a lower value during charging than during discharging, and the value of the constant a being varied during charging as an increasing function of the current I.

5 Claims, 2 Drawing Figures

METHOD AND DEVICE FOR MONITORING THE STATE OF CHARGE OF A STORAGE BATTERY

The invention relates to monitoring the state of charge of a storage battery.

It is known that, in order to completely recharge a storage battery which has previously been discharged by a quantity Qo of electricity, the battery must be supplied with a quantity kQo of electricity, where the factor k, called the recharging coefficient or factor, is higher than 1 and represents the inverse of the battery charging efficiency. The recharging factor applied must be determined carefully: if it is too low, the battery will not be charged enough; if it is too high, the battery will be charged too much and this will result in various drawbacks according to the type of battery and its mode of use. The least serious of these drawbacks is the need to maintain the electrolyte level for a non-sealed battery, and the most serious is the destruction of the battery by short-circuiting, explosion or overheating, as the case may be.

To determine the quantity of electricity required for proper recharging, it is known to monitor the state of charge of the battery continuously by providing a magnitude g which is proportional to the storage battery charging or discharge current I and of algebraically integrating said magnitude into data which is the image of the state of charge of the storage battery. The proportionality constant $a = g/I$ is different when charging and when discharging, precisely to take into account the charge efficiency of the battery, and charging is stopped when the image data represents the state of complete charge.

However, it has been observed that for some types of storage battery, in particular nickel-cadmium batteries, the choice of two different values for the constant a during charging and during discharging is not sufficient to provide optimum recharging of the batteries when the charging current is not constant. The aim of the invention is to remedy such insufficiency. The invention provides a method of monitoring the state of charge of a storage battery of the above-defined type, said method comprising varying the value of the coefficient a during charging as an increasing function of the current I.

The method in accordance with the invention takes into account the fact that the charging efficiency of the storage batteries concerned is always less than 1, and the lower the charging rate, i.e. the lower the charging current in relation to the battery capacity, the lower the charging efficiency.

The invention also provides a device for implementing the method, characterized in that it includes:

a current sensing resistor connected in series with the storage battery developing a voltage across its terminals that is algebraically proportional to the current I;

an amplification circuit which supplies an amplified voltage proportional to the voltage across the terminals of the current sensing resistor;

a voltage-to-frequency converter which delivers a train of pulses whose frequency, constituting said magnitude g, is proportional to the absolute value of said amplified voltage, with a proportionality constant which is a function of the sign of the amplified voltage and of its absolute value when the storage battery is being charged; and a logic counting circuit which is sensitive to said pulses and to the sign of the voltage at the terminals of the current sensing resistor, counting said pulses up or down in accordance with the said sign, the logic state of the counting circuit representing image data corresponding to the state of charge of the battery.

The invention will be better understood from the description of an embodiment given hereinbelow by way of illustration and having no limiting character, with reference to the accompanying drawing, in which FIGS. 1 and 2 constitute together the electric diagram of a device in accordance with the invention.

FIG. 1 shows that the charging or discharging current of a storage battery 1 passes via a current sensing resistor 2 which is series connected therewith. The voltage at its terminals is injected at the input of a chopper amplification circuit 3 which includes a first analogue changeover switch P1 controlled by a clock H fed by the battery 1. The clock delivers a periodic rectangular signal SH to the changeover switch P1. The signal has a frequency of 1 kHz, for example, and is constituted by a zero level voltage during a first half-period and by a positive level voltage called $V_{cc}$ during a second half-period, these levels being represented hereinafter respectively by the two numerals 0 and 1. The changeover switch P1 thus controlled is connected by both its contacts to terminals of the resistor 2 and transforms the input voltage into a periodic voltage whose variation amplitude is equal to the algebraic value of the input voltage.

The chopper amplification circuit 3 also includes an operational amplifier A1 whose non-inverting input is connected to the common point of the analogue changeover switch P1 and whose inverting input is connected firstly to earth via a resistor R7 and secondly to the output of the operational amplifier via a resistor R8.

The output of the operational amplifier A1 delivers an amplified AC voltage whose amplitude is proportional to said periodic voltage and in phase therewith. The output of the operational amplifier A1 is connected via a capacitor C1 to the common point of a second analogue changeover switch P2 controlled by the clock signal SH via a logic exclusive OR gate L1; a capacitor C'1 is connected between the two contacts of the analogue changeover switch P2 and one of its terminals is connected to earth.

One input of the gate L1 receives the signal SH from the clock and its other input receives a signal SP. It will be seen subsequently how the signal SP is generated. It assumes the value 1 when the battery 1 is charging and the value 0 when it is discharging. Therefore, the output signal of the gate L1 which is sent to the changeover switch P2 is identical to the signal SH when the battery is discharging and to the signal SH when the battery is charging, and the changeover switch P2 operates in in-phase synchronism with the changeover switch P1 during discharging and in anti-phase synchronism during charging, so that it demodulates the amplified AC voltage to provide a voltage of constant sign. After filtering, the demodulated voltage becomes a DC voltage proportional to the amplitude of the amplified AC voltage an hence to the current which passes through the resistor 2.

The signal SP is supplied on a wire F2 by a polarity detector 4, which includes a third analogue changeover switch P3 controlled by the clock signal SH and whose common point is connected to the output of the operational amplifier A1 via a capacitor $C_{20}$; a capacitor $C'_{20}$ is connected between the two contacts of the analogue changeover switch P3 and one of its terminals is connected to earth; the non-inverting input of a second operational amplifier A2 is connected firstly to the earthed terminal of the capacitor $C'_{20}$ via a resistor R9 and secondly to its output by a resistor R10; the inverting input of the operational amplifier A2 is connected firstly to the other terminal of the capacitor $C'_{20}$ via a resistor R11 and secondly to its output via a capacitor C. The analogue changeover switch P3 transforms the AC output voltage of the operational amplifier A1 into a DC voltage whose sign is the same as that of the input voltage; the DC voltage is transmitted to the operational amplifier A2, which is voltage hysteresis connected and whose output delivers the signal SP which represents the direction (i.e. charging or discharging) of the battery current I.

The amplified DC voltage which comes from the analogue changeover switch P2 is applied to the input of a voltage-to-frequency converter 5 which will be described subsequently and which generates a pulse train with a frequency f proportional to the DC voltage and therefore to the current I. The frequency f constitutes the magnitude g referred to in the definition of the invention. The proportionality constant a=f/I is influenced by a current generator 6.

The current generator 6 includes an operational amplifier A4 whose non-inverting input is connected to earth (zero potential) and whose inverting input is connected via a resistor R1 to the common point of an analogue changeover switch P4 and via a resistor R12 to the potential $V_{cc}$. The output of the amplifier A4 is connected to its inverting input via a resistor R2 and to the output of the generator via a resistor R3. One of the contacts of the changeover switch P4 is at zero potential and the other is connected to the potential $V_{cc}$ by a chain of resistors R4, R5, one part of which, namely R5, is in parallel with the emitter-collector path of a transistor T1. The changeover switch P4 is controlled by the signal SP supplied by the amplifier A2. It earths the resistor R1 when the battery 1 is discharging (SP=0) and connects it to the resistor R4 when the battery is being charged (SP=1). Also, a biasing signal A, conveyed by a wire F, is applied via a resistor R6 to the base of the transistor T1; the biasing signal is a function of image data relating to the state of charge of the battery 1, said data being supplied by a counting circuit 7 shown in FIG. 2 and integrating the pulses emitted by the converter 5. When the image data indicates a state of charge at least equal to a predetermined value, the value of the biasing signal A is 1 ($V_{cc}$), the transistor T1 is therefore non-conductive and the resistors R4 and R5 are interposed in series between $V_{cc}$ and the input of the changeover switch P4, which is brought to an intermediate potential between O and $V_{cc}$. In the contrary case, the value of the bias signal A is O, the transistor T1 is saturated and short-circuits the resistor R5. The potential at the input of the changeover switch P4 is therefore higher than previously. Therefore, the potential at the output of the switch P4—and hence at the negative input of the amplifier A4—and subsequently the current j generated by the current generator 6 can assume three different values according to the direction of the current I and the state of charge of the battery. When the battery is discharging, $j=j_0$; when the batery is being charged, and its state of charge is at least equal to the threshold value, $j=j_1>j_0$; and when the battery is being charged and its state of charge is lower than the threshold value, $j=j_2>j_1$.

The voltage-to-frequency converter 5 includes an operational amplifier A5 whose non-inverting and inverting inputs receive the amplified DC voltage supplied by the changeover switch P2 of the circuit 3, the non-inverting input being connected to the terminal of the capacitor $C'_1$ which is earthed, the inverting input being connected to the other terminal of said capacitor $C'_1$ via a resistor R13; the output of the operational amplifier A5 is connected to pin No. 2 of a type 555 integrated monostable circuit K1. Pins No. 6 and 7 of the circuit K1 are jointly connected firstly to the potential $V_{cc}$ via a resistor R14, secondly to earth via a capacitor C3 and lastly via a resistor R22 to the common point of an analogue changeover switch P7 controlled by the signal SP, the contacts of the analogue changeover switch being connected to respective contacts of the changeover switch P2. A capacitor C2 is connected between the inverting input and the output of the operational amplifier A5. The contacts of an analogue changeover switch P5 are connected in parallel with the inputs of the amplifier A5. The changeover switch P5 is controlled by the pulses at the frequency f which are supplied by pin No. 3 of the monostable circuit K1 via a wire F1. The common point of the changeover switch P5 is connected to the output of the current generator 6. A saw-tooth signal is generated at the output of the amplifier A5 and is transformed by the monostable circuit K1 into a train of rectangular pulses, the frequency f of the saw-tooth signal and of the pulse train being proportional to the input voltage $V_e$ of the converter 5 and therefore to the current passing through the battery 1, with a proportionality constant a=f/I which is inversely proportional to the current j produced by the current generator 6 and to the duration h of the positive pulses.

This duration h is the time necessary for charging the capacitor C3 to the voltage $2V_{cc}/3$. When the battery 1 is being discharged, the changeover switch P7 earths the resistor R22. The resistor is therefore connected directly in parallel with the capacitor C3 and we have:

$$h_o = - \frac{R14 \cdot R22 \cdot C}{R14 + R22} \operatorname{Log}\left(1 - \tfrac{2}{3}\left(\frac{R14 + R22}{R22}\right)\right)$$

where C is the capacity of the capacitor C3.

When the battery 1 is being charged, the changeover switch P7 connects the resistor R22 to the positive pole of the input voltage $V_e$, which is therefore in series with R22 between the terminals of C3. We then have:

$$h_1 = - \frac{R14 \cdot R22 \cdot C}{R14 + R22} \operatorname{Log}\left(1 - \tfrac{2}{3}\frac{R14 + R22}{R22 + \frac{V_e}{V_{cc}} R14}\right)$$

Figure 2:
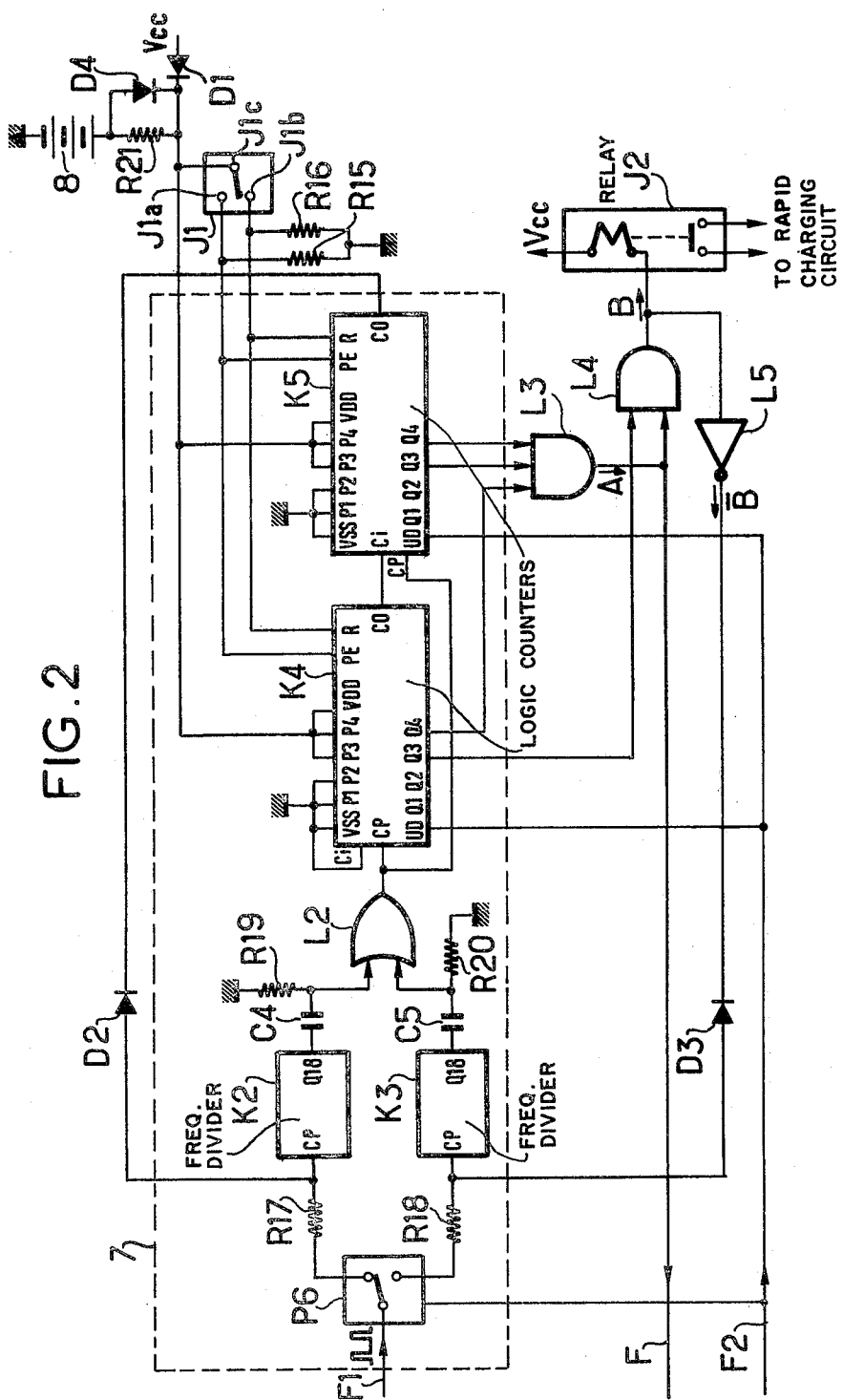

The pulse train at the frequency f is applied via the wire F1 to the common point of an analogue switch P6 of the logic counting circuit 7 illustrated in FIG. 2. The analogue switch P6 controlled by the signal SP via wire F2 directs the pulses towards a first frequency divider K2 via a resistor R17 when the battery is discharging and towards a second frequency divider K3 via a resistor R18 when the battery is being charged. The dividers K2 and K3 are type 14521 integrated circuits. They divide the frequency applied to their inputs CP by $2^{18}$, i.e. when one of them receives the pulse train at the frequency f, it generates an output rectangular signal of frequency $2^{-18}f$. The outputs Q18 of the dividers K2 and K3 are connected respectively by capacitors C4 and C5 to the inputs of a logic OR gate L2 so that when level 1 is applied to the output of one of the dividers, i.e. when the converter 5 generates $2^{18}$ pulses, a temporary level 1 is applied to the output of the gate L2; the point common to the capacitor C4 and to the corresponding input of the OR gate L2 is connected to earth via a resistor R19; the point common to the capacitor C5 and to the corresponding input of the OR gate L2 is connected to earth by a resistor R20. The output level is transmitted to the inputs CP of two 14516 type logic counters K4 and K5, the Co ("carry out") output of the counter K4 being connected to the $C_i$ ("carry in") input of the counter K5. Both these counters thus associated act as a single counter having 256 logic states each of which will be referred to hereinafter by an eight-digit binary number, the first four digits representing the state of the counter K5 and the last four representing that of the counter K4.

The signal SP from the amplifier A2 is applied via the wire F2 to the UD ("up/down") inputs of the two counters so as to count up the pulses they receive during charging and to count down the pulses they receive during discharging. The logic state of the counting circuit therefore results from the algebraic integration of the frequency f, proportional to the current I which passes through the battery 1 and constitutes image data representative of the state of charge of the battery.

The P1 and P2 inputs ("presets" 1 and 2) of the counters K4 and K5 are at level 0 and their P3 and P4 inputs ("presets" 3 and 4) are at level 1. The PE ("preset enable") terminals of the two counters are connected to a fixed contact J1a of a three position switch J1 and to one end of a resistor R15 whose other end is at the level 0. The R ("reset") terminals of the counters are connected to another fixed contact J1b of the switch J1 and to one end of a resistor R16 whose other end is also at the level 0. The moving contact J1c of the switch J1 is connected to the cathode of a diode D1 whose anode is at the level 1 ($V_{cc}$).

The state of the counters is decoded as follows. A diode D2 is connected in the forward direction between the input CP of the divider K2 and the Co ("carry out") terminal of the counter K5. The terminals Q4 of the counters K4 and K5 and Q3 of the counter K5 are connected to the three inputs of a logic AND gate L3 whose output delivers the bias signal A, the output of the AND gate L3 being connected to the wire F and to the input of a logic AND gate L4 another input of which is connected to the terminal Q3 of the counter K4. The output of the AND gate L4 is connected to one end of the coil of a relay J2 whose other end is at the potential $V_{cc}$, the contacts of the relay being inserted in a circuit, not shown, for rapid charging of the battery 1. A diode D3 is connected in the forward direction between the input CP of the divider K3 and the output of a logic inverter L5 whose input is connected to the output of the AND gate L4.

The general operation of the device will be described assuming that the battery 1 is used as a standby battery, i.e. that it is normally maintained in the charged state by a battery charger fed by a source which also feeds a load and that the battery is substituted for the source in the case of breakdown thereof. Operation would be the same if the battery were used as a buffer battery with suitably regulated charging current.

It is assumed that when the device is put into service, the battery 1 is completely charged. By momentarily establishing the connection J1a–J1c via the switch J1, the state of the counting circuit is set to 11001100, which constitutes the image of the state of complete charge of the battery. The output signals A and B of the gate L3 and L4 respectively are at level 1 and the signal $\overline{B}$ supplied by the inverter L5 is at level 0. The coil of the relay J2 is not fed with electricity and its contacts are open, so that no rapid charging current passes through the battery. However, as long as the source operates normally, a maintenance charging current is applied to the battery, producing a signal SP at a level 1 and the analogue switch P6 connects the output of the voltage-to-frequency converter 5 to the divider K3. But the pulses generated by the converter are shunted by the diode D3 and are not taken into consideration by the counting circuit. Therefore the maintenance charging current which has no effect on the state of charge of the battery does not modify the state of the counters which is the image of the state of charge.

If the source is no longer available and the battery 1 is required to discharge, the signal SP assumes level 0 and the pulses of the converter 5, at frequency $f_o$, are transmitted to the divider K2 then, after division by $2^{18}$, to the counters K4 and K5 which count them down. $f_o$ is equal to $a_o I$, with $$a_o = m/j_o h_o,$$

where m is a device constant. When the current source is applied again, the rapid charging rate is applied to the battery (if the depth of discharge is sufficient for the signal B to be at level 0), the current j assumes the value $j_1$ or $j_2$ according to the depth of discharge detected by the gate L3 whose output signal A controls the transistor T1 and the duration h assumes the value $h_1$ which is itself dependent on $V_e$ and therefore on the current I. The coefficient a therefore becomes $$a_1 = m/j_1 h_1$$

or $$a_2 = m/j_2 h_1.$$

When the signal SP has returned to level 1, the pulses generated at the frequency $f_1 = a_1 I$ or $f_2 = a_2 I$ are transmitted to the divider K3, then, after division, to the counters K4 and K5 which count them positively. Rapid charging stops when the counters return to the initial state 11001100, i.e. after a number of pulses equal to that recorded during discharge. The recharging factor is $k = a_o/a_m$, where $a_m$ is the average value of a during charging, said average value being equal to $a_1$ if the depth of discharge does not exceed the switching threshold of the gate L3 and otherwise lying between $a_1$ and $a_2$, the deeper the discharge, the lower the value of a. Thus the deeper the discharge, the higher the recharging factor to take into account the fact that the recharging efficiency is a decreasing function of depth of discharge.

For a constant depth of discharge the coefficient $a_m$ is inversely proportional to $h_1$ and can be written $a_m = m/j_m h_1$, where $j_m$ designates the average value of the current j during charging. On referring to the above formula which allows $h_1$ to be calculatd, it is observed that $h_1$ varies as a decreasing function of the input voltage $V_e$ of the converter 5 and therefore of the current I, $h_1$ being equal to $h_o$ when $V_e=0$. Therefore the proportionality constant $a_m = m/j_o h_1$ varies as an increasing function of the current I, and the recharging factor $$k = \frac{a_o}{a_m} = \frac{j_m h_1}{j_o h_o}$$

varies as a decreasing function of I.

The field of variation of the factor k can be characterized by the following four values:

$$-k_{10} = \frac{j_1}{j_o}$$

which is the limit of $$k_1 = \frac{a_o}{a_1} = \frac{j_1 h_1}{j_o h_o}$$

when the charging current $I_1$ tends towards 0, $$-k_{1M} = \frac{j_1 h_M}{j_o h_o}$$

which is the value of $k_1$ corresponding to the maximum charging current $I_{1M}$, $$-k_{20} = \frac{j_2}{j_o}$$

which is the limit of $$k_2 = \frac{a_o}{a_2} = \frac{j_2 h_1}{j_o h_o}$$

when $I_1$ tends toward 0, $$-k_{2M} = \frac{j_2 h_M}{j_o h_o}$$

which is the value of $k_2$ corresponding to the maximum charging current $I_{1M}$, where $h_M$ designates the value of $h_1$ obtained for the current $I_{1M}$.

The maximum charging current $I_{1M}$ can be imposed at the time of construction when the device in accordance with the invention is incorporated in a circuit which includes charging means. Failing such a practical limit, it will be considered that the maximum current is the current which must not be exceeded if damage to the storage batteries is to be avoided.

These four characteristic values of k can be fixed at will by varying the ratios $j_1/j_o$, $j_2/j_o$, and R22/R14. Indeed, the first two of these ratios define respectively $k_{10}$ and $k_{20}$ and the third defines $$\frac{h_M}{h_o} = \frac{k_{1M}}{k_{10}} = \frac{k_{2M}}{k_{20}}.$$

By way of example, for a sealed nickel-cadmium storage battery with thin sintered electrodes which operate in a temperature range of about 5° to 30° C., the following values can be adopted :

$$k_{10} = 1.2 \quad k_{20} = 1.44 \quad k_{1M} = 1 \quad k_{2M} = 1.2$$

the current $I_{1M}$ being that which, integrated over one hour, supplies a quantity of electricity equal to the nominal capacity of the battery and the coefficient passing from $a_1$ to $a_2$ for a depth of discharge of about 2.5%.

In these conditions, the recharging coefficient passes from about 1.2 to 1.4, according to the depth of discharge, for a very small charging current and from about 1 to 1.2 for the maximum charging current.

The invention is not limited to the embodiment described and illustrated. In particular, during discharging, the end of the resistor R22 which is not connected to the capacitor C3, instead of being earthed, can be disconnected. We then have:

$$h_o = R14.C \text{ Log } 3$$

This multiplies the ratio $h_1/h_o$ by a constant factor and therefore does not modify the law by which the recharging coefficient varies as a function of I, nor that for $a_m/a_o$ at constant depth of discharge. If it is required to modify the law of variation to take into account a given law of charging efficiency variation, use must be made of other ways of affecting the voltage-to-frequency conversion coefficient, these means themselves not being limited to the example described. The magnitude g can also be other than a frequency and can be integrated in another form than that of a logic state.

The variation of coefficient a as a function of the charging current can be obtained independently from its variation as a function of the depth of discharge or, on the contrary, it can be combined with its variation as a function of other parameters such as the temperature of the battery during charging and/or during discharge. Further, means for correcting the image data relating to the state of charge of the battery can be provided to take into account, for example, its self-discharge when there is no current.

We claim

1. A method of monitoring the state of charge of a storage battery, said method including the steps of generating a magnitude g which is proportional to the storage battery charging or discharging current I and of algebraically integrating said magnitude into data which is the image of the state of charge of the storage battery, the proportionality constant $a = g/I$ between said magnitude and said current being given a lower value during charging than during discharging, wherein the improvement comprises varying the value of the constant a during charging as an increasing function of the current I.

2. A device for monitoring the state of charge of a storage battery, said device including
a current sensing resistor connected in series with the storage battery developing a voltage across its terminals that is algebraically proportional to the charging or discharging current I of the battery;
an amplification circuit which supplies an amplified voltage proportional to the voltage across the terminals of the current sensing resistor;
a voltage-to-frequency converter which delivers a train of pulses whose frequency is proportional to the absolute value of said amplified voltage, with a proportionality coefficient a which is a function of the sign of the amplified voltage;
and a logic counting circuit which is sensitive to said pulses and to the sign of the voltage at the terminals of the current sensing resistor, counting said pulses up or down in accordance with said sign, the logic state of the counting circuit representing an image of the state of charge of the storage battery, wherein the improvement comprises:

said voltage-to-frequency converter includes means for varying the value of said proportionality coefficient a during charging of the storage battery as an increasing function of the absolute value of said amplified voltage.

3. A device according to claim 2, wherein said converter includes a capacitor whose charging time determines said frequency and means for connecting the charging circuit of said capacitor to said amplified voltage when the storage battery is being charged.

4. A device according to claim 3, wherein said capacitor is series connected with a first resistor between the terminals of a constant voltage source, and said means for varying the proportionality coefficient a as an increasing function of said amplified voltage comprises a second resistor and means for series connecting said second resistor with said amplified voltage in parallel with the capacitor when the storage battery is being charged.

5. A device according to claim 4, further comprising means for connecting said second resistor directly in parallel with the capacitor when the storage battery is discharging.

* * * * *